United States Patent
Seo et al.

(10) Patent No.: US 7,279,416 B2
(45) Date of Patent: Oct. 9, 2007

(54) METHODS OF FORMING A CONDUCTIVE STRUCTURE IN AN INTEGRATED CIRCUIT DEVICE

(75) Inventors: Jung-hun Seo, Seoul (KR); Gil-Heyun Choi, Gyeonggi-do (KR); Jong-Myeong Lee, Gyeonggi-do (KR); Hee-sook Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 92 days.

(21) Appl. No.: 10/796,437

(22) Filed: Mar. 9, 2004

(65) Prior Publication Data

US 2004/0248397 A1    Dec. 9, 2004

(30) Foreign Application Priority Data

Jun. 3, 2003    (KR) ...................... 10-2003-0035657

(51) Int. Cl.
*H01L 21/4763* (2006.01)
(52) U.S. Cl. ...................... 438/648; 438/643; 438/644; 257/E27.001
(58) Field of Classification Search ................ 438/642, 438/643, 644, 648, 685
See application file for complete search history.

(56) References Cited

U.S. PATENT DOCUMENTS 6,838,772 B2 *    1/2005    Saitoh et al. ................ 257/758

2002/0072227 A1    6/2002    Russell et al. .............. 438/653

FOREIGN PATENT DOCUMENTS

| JP | 08-078520 | 3/1996 |
|---|---|---|
| KR | 1999-6108 | 1/1999 |
| KR | 2002-83573 | 11/2002 |

OTHER PUBLICATIONS

Notice to File a Response/Amendment to the Examination Report for Korean application No. 10-2003-0035657 mailed on May 4, 2005.

* cited by examiner

*Primary Examiner*—Zandra V. Smith
*Assistant Examiner*—Christy L Novacek
(74) *Attorney, Agent, or Firm*—Myers Bigel Sibley & Sajovec

(57) ABSTRACT

A conductive structure is formed in an integrated circuit device by forming a lower conductive pattern on a substrate. A barrier metal layer is formed on the lower conductive pattern. The barrier metal layer is flushed with a gas that includes a halogen group gas and an upper conductive layer is formed on the barrier metal layer.

38 Claims, 7 Drawing Sheets

METHODS OF FORMING A CONDUCTIVE STRUCTURE IN AN INTEGRATED CIRCUIT DEVICE

RELATED APPLICATION

This application claims priority to and the benefit of Korean Patent Application No. 2003-35657, filed Jun. 3, 2003, the disclosure of which is hereby incorporated herein by reference.

FIELD OF THE INVENTION

The present invention relates to integrated circuit devices and methods of forming the same, and, more particularly, methods of forming a conductive structure in an integrated circuit device.

BACKGROUND OF THE INVENTION

Various kinds of conductive materials are used in semiconductor devices. The conductive materials may form an interconnection structure that connects electrical components in the semiconductor devices. A metallic process for forming an interconnection structure is typically a finishing step in forming integrated circuit devices and may affect the yield and/or reliability of such devices.

The conductive materials may make contact with different conductive materials and insulating materials. As a result, the conductive material may be pilled off due to differences in thermal expansion coefficients. In addition, when different conductive materials contact each other, a low-conductivity material may be formed, which may raise the resistance of an interconnection structure. To solve those problems, a specific conductive material referred to as "a barrier metal layer" has been used.

A barrier metal layer is conventionally used in connecting different conductive patterns through a gap region having a relatively large aspect ratio, such as a contact hole or a via hole. It is generally desirable that the barrier metal layer have good step coverage to conformally cover a gap region that has a relatively large aspect ratio. As mentioned above, the barrier metal layer may be formed in a final processing step; that is, it may be formed on a resultant structure with a transistor or a capacitor or the like. The step of forming the barrier metal layer may be, therefore, performed at a relatively low temperature to avoid damaging the transistor and/or the capacitor due to a high temperature. It may also be desirable to form the barrier metal layer at a relatively low temperature when the interconnection structure includes an aluminum layer that has a relatively low melting point.

The barrier metal layer may be formed by means of physical vapor deposition (PVD), for example, a sputtering method. Unfortunately, PVD typically provides relatively poor step coverage making PVD less desirable for use in forming a barrier metal layer in a gap region that has a relatively large aspect ratio.

A method of forming a barrier metal layer by using chemical vapor deposition (CVD) has been proposed to solve the problem caused by PVD. The CVD method can be used to form a barrier metal layer that has relatively good step coverage, but, unfortunately, raises the process temperature. A metal organic CVD method has been used, however, which provides a relatively low temperature process and relatively good step coverage.

FIGS. 1 and 2 are cross-sectional views that illustrate a conventional method of forming a conductive structure on a semiconductor substrate. Referring now to FIGS. 1 and 2, a lower conductive pattern 20 is formed on a semiconductor substrate 10. An interlayer dielectric layer 30 is formed on a surface of the semiconductor substrate 10 with the lower conductive pattern 20, and then patterned to form a via hole 35 that exposes a top surface of the lower conductive pattern 20. A barrier metal layer 40 is formed to conformally cover an inner sidewall of the via hole 35 and a top surface of the interlayer dielectric layer 30. The barrier metal layer 40 is formed by using CVD with a metal organic precursor. An upper conductive layer 50 is then formed on the barrier metal layer 40 to fill the via hole 35.

Carbon may be included in the barrier metal layer 40 because of the metal organic precursor. In this case, the barrier metal layer 40 may have a relatively porous structure. When the porous barrier metal layer 40 is exposed in a fabrication line, oxygen in the air may penetrate the barrier metal layer 40. The penetration of oxygen may increase the resistance of the barrier metal layer 40, which may result in signal transfer delay and/or power dissipation. A plasma treatment may be applied during or immediately after forming the barrier metal layer 40. The plasma treatment may reduce or remove the carbon in the barrier metal layer 40 that was formed due to use of the metal organic precursor.

According to an experiment performed using the conventional method described above with respect to FIGS. 1 and 2, the gap fill characteristic of the upper conductive layer 50 was generally good if the aspect ratio ($h_1/W_1$) of the via hole 35 is four or less as illustrated in FIG. 1. When the aspect ratio ($h_2/W_2$) of the via hole 35 was increased, however, the upper conductive layer 50 could not fill the via hole 35 completely as illustrated in FIG. 2.

The plasma treatment may be less effective as the aspect ratio increases because of the relation between the aspect ratio and the gap fill characteristic. That is, it may be difficult for ionized atoms to reach a lower part of the gap region that has a large aspect ratio, such that the carbon may not be effectively removed there. Thus, the oxygen penetrating the region, including non-removed carbon, is outgassed before a subsequent upper metal layer 50 is formed. The outgassed gas may degrade the gap fill characteristic and the adhesion characteristic of the upper metal layer 50. As a result, voids 55 may be formed in the via hole, as shown in FIG. 2.

SUMMARY

According to some embodiments of the present invention, a conductive structure is formed by forming a lower conductive pattern on a substrate. A barrier metal layer is formed on the lower conductive pattern. The barrier metal layer is flushed with a gas that comprises a halogen group gas and an upper conductive layer is formed on the barrier metal layer.

In accordance with other embodiments of the present invention, the gas comprises a transition metal. The gas may further comprise helium, neon, argon, hydrogen, and/or nitrogen.

In accordance with still other embodiments of the present invention, the barrier metal layer is flushed at a temperature of about 200° C. to about 500° C.

In accordance with still other embodiments of the present invention, the barrier metal layer is flushed with argon gas with a flux of about 500 sccm to about 10000 sccm and TiCl$_4$ gas with a flux of about 1 sccm to about 100 sccm at a temperature of about 300° C. to about 450° C. The barrier metal layer may be flushed at a pressure of about 1 torr to about 100 torr for about 1 sec to about 10 minutes.

In accordance with further embodiments of the present invention, the barrier metal layer is degassed before it is flushed. For example, the barrier metal layer may be degassed using an inert gas at a temperature of about 200° C. to about 500° C. and a pressure of about 1 mTorr to about 100 Torr.

In accordance with still further embodiments of the present invention, a second barrier metal layer may be formed on the first barrier metal layer before forming the upper conductive layer.

In accordance with still further embodiments of the present invention, the second barrier metal layer may be formed using physical vapor deposition, for example, sputtering.

In accordance with still further embodiments of the present invention, the second barrier metal layer comprises titanium nitride, titanium silicon nitride, tantalum silicon nitride, and/or tantalum nitride.

In accordance with other embodiments of the present invention, the barrier metal layer is formed using atomic layer deposition. Moreover, forming the barrier metal layer using atomic layer deposition and flushing the barrier metal layer may be performed at least twice.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF EMBODIMENTS

Figure 1:
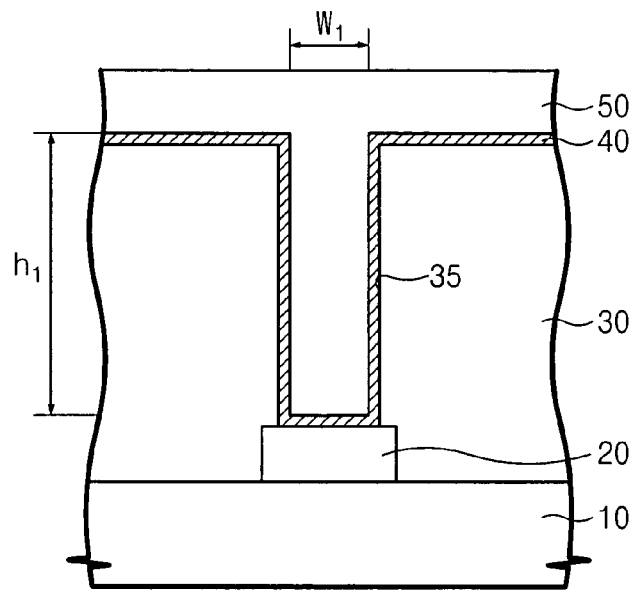
FIGS. 1 and 2 are cross-sectional views that illustrate a conventional method of forming a conductive structure on a semiconductor substrate.
Figure 2:
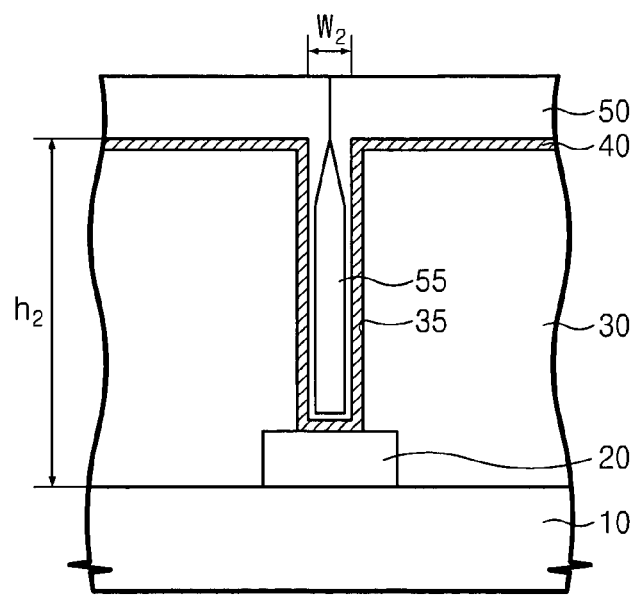

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures. In the figures, the dimensions of layers and regions are exaggerated for clarity. It will also be understood that when an element, such as a layer, region, or substrate, is referred to as being "on" another element, it can be directly on the other element or intervening elements may be present. In contrast, when an element, such as a layer, region, or substrate, is referred to as being "directly on" another element, there are no intervening elements present.

Figure 3:
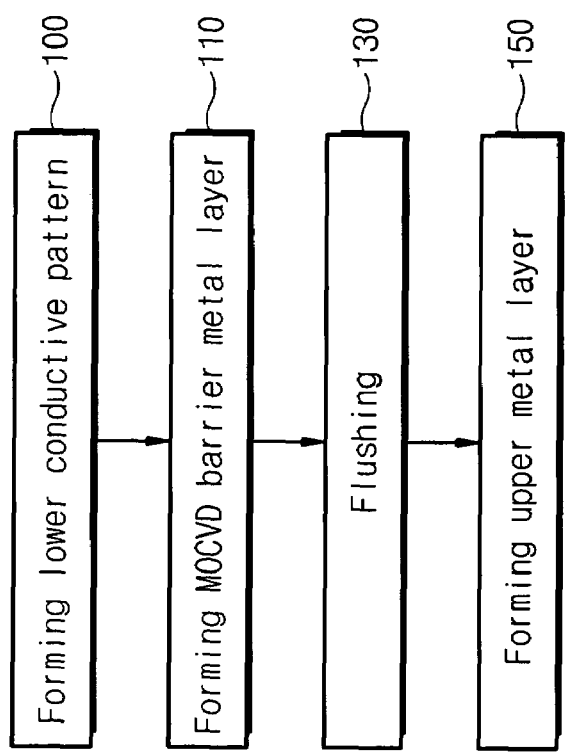

FIGS. 3-10 are flowcharts that illustrate methods of forming a conductive structure on a semiconductor substrate in accordance with some embodiments of the present invention. FIG. 11 is a cross-sectional view that illustrates a conductive structure on a substrate and methods of forming the same in accordance with some embodiments of the present invention. Referring now to FIGS. 3 and 11, a lower conductive pattern 20 is formed on a semiconductor substrate 10 (block 100). An interlayer dielectric layer 30 is formed on the semiconductor substrate 10 including the lower conductive pattern 20. The interlayer dielectric layer 30 is patterned to form an opening 35 exposing a top surface of the lower conductive pattern 20. A barrier metal layer 40 is formed on the resultant structure with the opening 35 (block 110). A flushing process may be performed after formation of the barrier metal layer 40 (block 130). An upper conductive layer 50 is formed on the barrier metal layer 40 to fill the opening 35 (block 150).

The lower conductive pattern 20 may comprise, for example, tungsten (W), aluminum (Al), polysilicon (Si), copper (Cu), titanium (Ti), titanium nitride (TiN), tantalum (Ta), tantalum silicon nitride (TaSiN), and/or tantalum nitride (TaN). In addition, the lower conductive pattern 20 may be formed on a semiconductor substrate that includes a metal-oxide-silicon field effect transistor (MOSFET) and/or a capacitor structure. As a result, the lower conductive pattern 20 may be, for example, a bit line, a source line, a metal interconnection and/or a gate pattern.

The barrier metal layer 40 may comprise titanium nitride (TiN), titanium silicon nitride (TiSiN), tantalum silicon nitride (TaSiN), and/or tantalum nitride (TaN). In addition, the barrier metal layer 40 may be formed using CVD with a metal organic precursor. The metal organic precursor may be tetrakis-diethyl-amido-titanium (TDEAT) and tetrakis-dimethyl-amido-titanium (TDMAT) if the barrier metal layer 40 comprises titanium nitride. Forming the barrier metal layer 40 may include plasma treatment with a processing gas that comprises hydrogen ($H_2$) and/or nitrogen ($N_2$). The plasma treatment may reduce or remove carbon components included in the barrier metal layer 40. As semiconductor devices become more highly integrated, however, the gap regions may have larger aspect ratios, which may reduce the effectiveness of the plasma treatment as discussed above.

The ineffectiveness of the plasma treatment may be reduced by using the flushing process of block 130. According to some embodiments of the present invention, the barrier metal layer 40 may be flushed by using at least one gas selected from the group consisting of gases containing a halogen group element and gases containing a halogen group element and a transition metal at a temperature of about 200° C. to 500° C. In this case, the gas used for flushing may further comprise at least one gas selected from the inert gases including helium (He), neon (Ne) and argon (Ar), hydrogen gas ($H_2$), and nitrogen gas ($N_2$). The barrier metal layer 40 may be flushed by supplying argon gas with a flux of about 500 sccm to 10000 sccm and $TiCl_4$ gas with a flux of about 1 sccm to 100 sccm at about 300° C. to 450° C. In addition, flushing the barrier metal layer 40 may be performed at a pressure of about 1 torr to 100 torr for about 1 sec to 10 min.

The upper conductive layer 50 may comprise tungsten (W), aluminum (Al), polysilicon (Si), and/or copper (Cu). In some embodiments, the barrier metal layer 40 may be flushed immediately before forming the upper conductive layer 50. If the lower conductive pattern 20 or the upper conductive layer 50 comprises aluminum, then the aluminum may be formed by metal organic chemical vapor deposition (MOCVD) using methylpyrrolidine (MPA), dimethylethylamine alane (DMEAA), dimethylalumium hydride (DMAH), and/or trimethylamine alane (TDMA) as a precursor.

Figure 4:
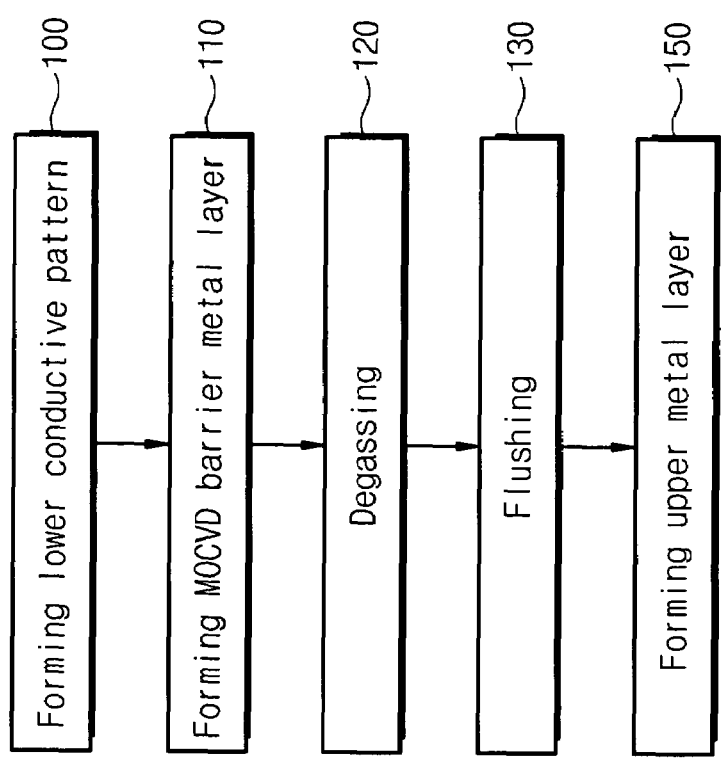
FIGS. 3-10 are flowcharts that illustrate methods of forming a conductive structure on a semiconductor substrate in accordance with some embodiments of the present invention.

Referring now to FIG. 4, a degassing operation (block 120) may be performed to remove an outgassing source in the barrier metal layer 40 before the flushing operation is performed at block 130. Oxygen gas in the air may penetrate the barrier metal layer 40 while the semiconductor substrate 10 with the barrier metal layer 40 thereon waits to be processed in a fabrication line. If the oxygen gas penetrates the barrier metal layer 40, then the subsequent process for forming the upper metal layer 50 may have a relatively poor gap-fill characteristic. In addition, the oxygen gas may be released when the semiconductor substrate 10, including the barrier metal layer 40, is loaded into a relatively low-pressure process chamber to form the upper metal layer 50. This released gas is generally referred to as an outgassing source.

The degassing operation (block 120) may be performed at about 200° C. to 500° C. at a pressure of about 1 mTorr to 100 Torr (i.e., a relatively low pressure). The degassing operation (block 120) may be carried out using an inert gas ambience, such as argon.

As shown in Table 1 below, the upper metal layer 50 had a "bad" gap-fill characteristic when degassing was performed at about 400° C. (degassing step 1). Meanwhile, the upper metal layer 50 had a "good" gap-fill characteristic when the degassing was performed at about 500° C. (degassing step 2). The temperature of 500° C., however, is high enough to cause a diffusion of impurities and/or a fusion of aluminum. Thus, for semiconductor devices that require low temperature fabrication processing, degassing alone may not be sufficient to provide a suitable gap-fill characteristic for the upper metal layer 50.

TABLE 1

|  | degassing step 1 (400° C.) | degassing step 2 (500° C.) | degassing step 3 (300° C.) + flushing step (400° C.) | flushing step (400° C.) |
|---|---|---|---|---|
| gap-fill characteristic of upper metal layer | bad | good | good | good |

When degassing (block 120) at about 300° C. and flushing (block 130) were both performed or only flushing (block 130) was performed, an upper metal layer 50 having a "good" gap-fill characteristic was formed. Thus, according to some embodiments of the present invention, flushing (block 130) can be used to allow a degassing temperature to be reduced or to omit the degassing operation.

Figure 5:
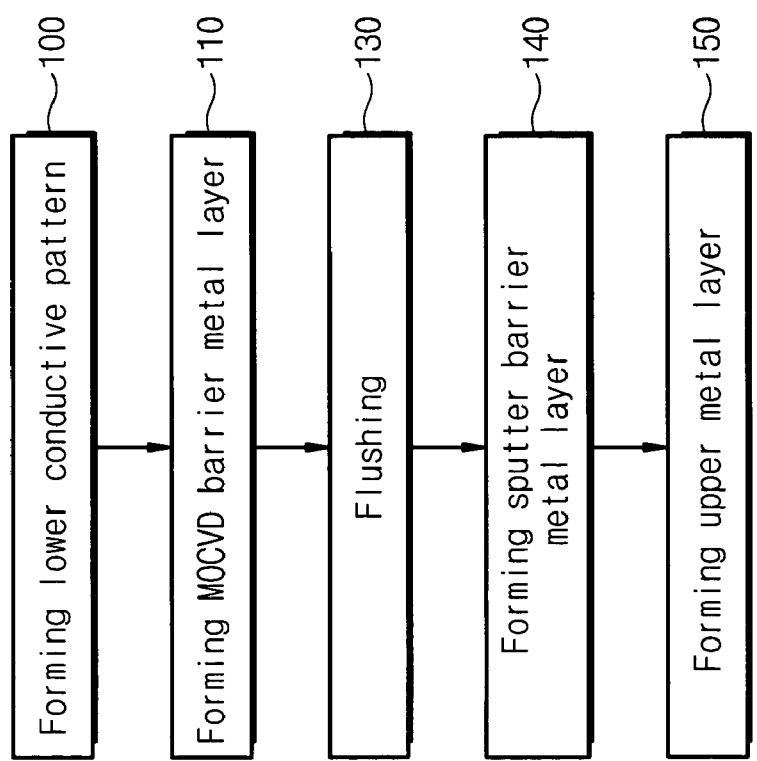
Figure 12:
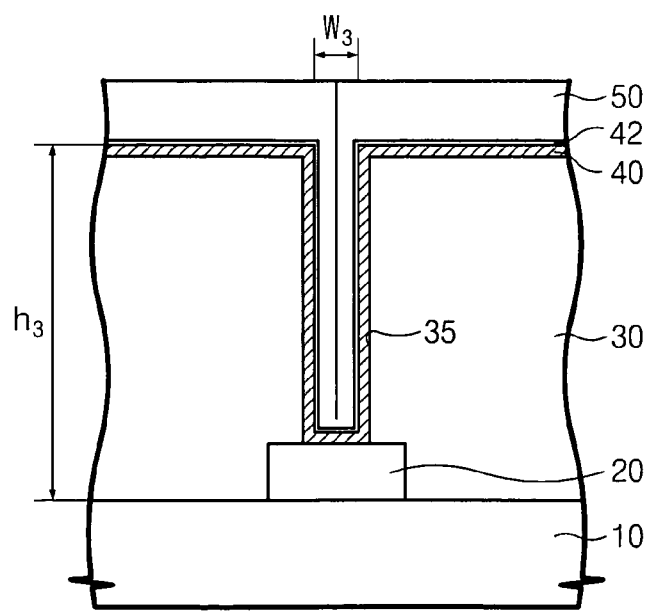

Referring now to FIGS. 5 and 12, in accordance with some embodiments of the present invention, a second barrier metal layer 42 may be formed on the surface of the barrier metal layer 40 (block 140) after the flushing operation (block 130). The second barrier metal layer 42 may be formed using physical vapor deposition (PVD) including sputtering. PVD is conventionally carried out at relatively low temperatures without organic materials, such as metal organic precursors.

Thus, the time that the barrier metal layer 40 is exposed in the fabrication line may be reduced due to the formation of the second barrier metal layer 42, which may reduce the amount of oxygen that penetrates the barrier metal layer 40. The second barrier metal layer 42 may comprise titanium nitride (TiN), titanium silicon nitride (TiSiN), tantalum silicon nitride (TaSiN), and/or tantalum nitride (TaN).

Figure 6:
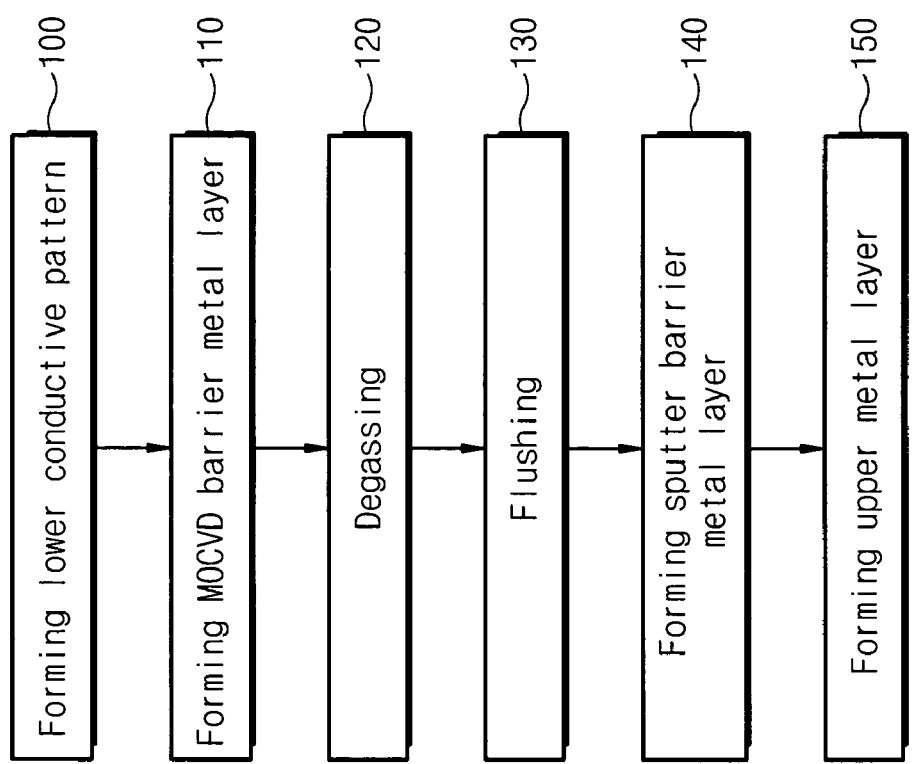

According to some embodiments of the present invention, the degassing operation (block 120) illustrated in FIG. 4 and the formation of the second barrier metal layer 42 by means of sputtering (block 140) illustrated in FIG. 5 may also be applied to the embodiments illustrated in FIG. 3. Referring now to FIGS. 6 and 12, the operations described above with respect to FIG. 3 are performed along with the additional operations of block 120 of FIG. 4 and block 140 of FIG. 5. As illustrated by block 110 of FIGS. 3 and 6, the barrier metal layer 40 may be formed using MOCVD. The barrier metal layer 40 may also be formed using atomic layer deposition.

Figure 7:
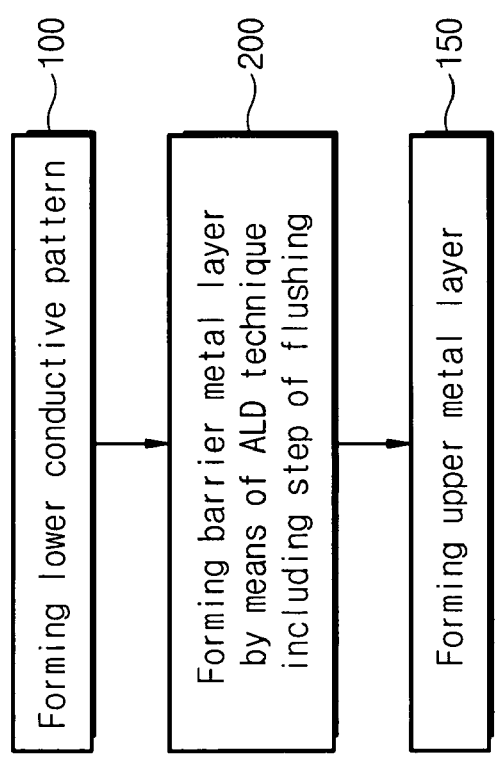

Referring now to FIGS. 7 and 11, a lower conductive pattern 20 is formed on the semiconductor substrate 10 (block 100). A barrier metal layer 40 is formed on a surface of the semiconductor substrate 10 with the lower conductive pattern 20 formed thereon by using atomic layer deposition (block 200). An upper metal layer 50 is formed on the barrier metal layer 40 (block 150). The lower conductive pattern 20 and the upper metal layer 50 may be formed as discussed above with respect to other embodiments of the present invention.

Figure 9:
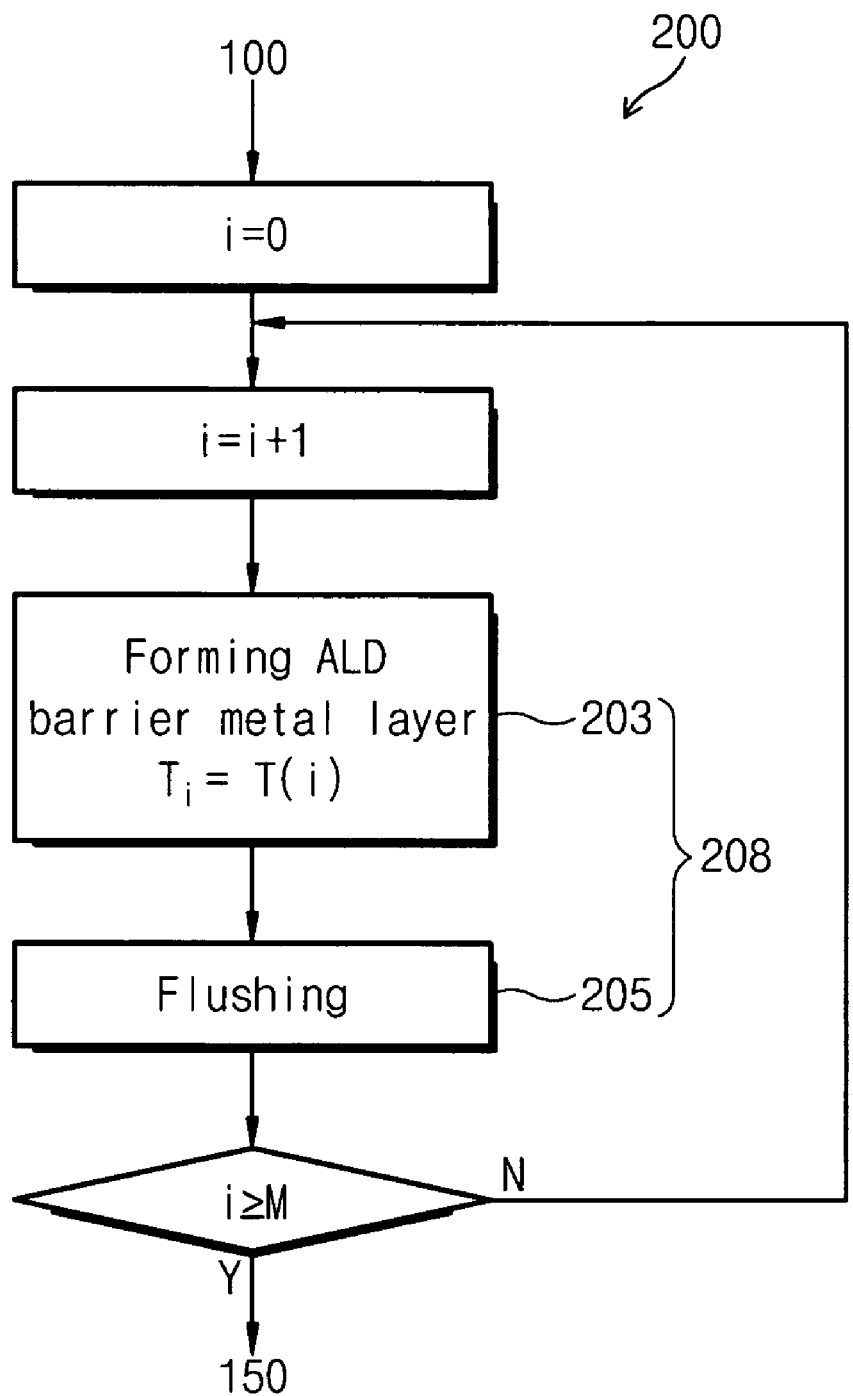

Referring now to FIG. 9, the barrier metal layer 40 may be formed through repeated atomic layer deposition and flushing operations. For example at block 203, the barrier metal layer 40 is formed using atomic layer deposition. At block 205, the formed barrier metal layer 40 is flushed as described, for example, with respect to block 130 of FIG. 3. In accordance with various embodiments of the present invention, the process cycle 208 may repeat at least once. Moreover, the atomic layer deposition process may use different process conditions during the process cycles such that the deposition thickness changes ($T_i$=T(i), $T_i$=ith deposition thickness, i=a number of cycle). In some embodiments, a purging operation may be performed before or after the flushing operation (block 205). One or more of the following gases may be used as a purge gas: nitrogen ($N_2$), hydrogen ($H_2$), ammonia ($NH_3$), and/or tetra chloride titan ($TiCl_4$).

Figure 10:
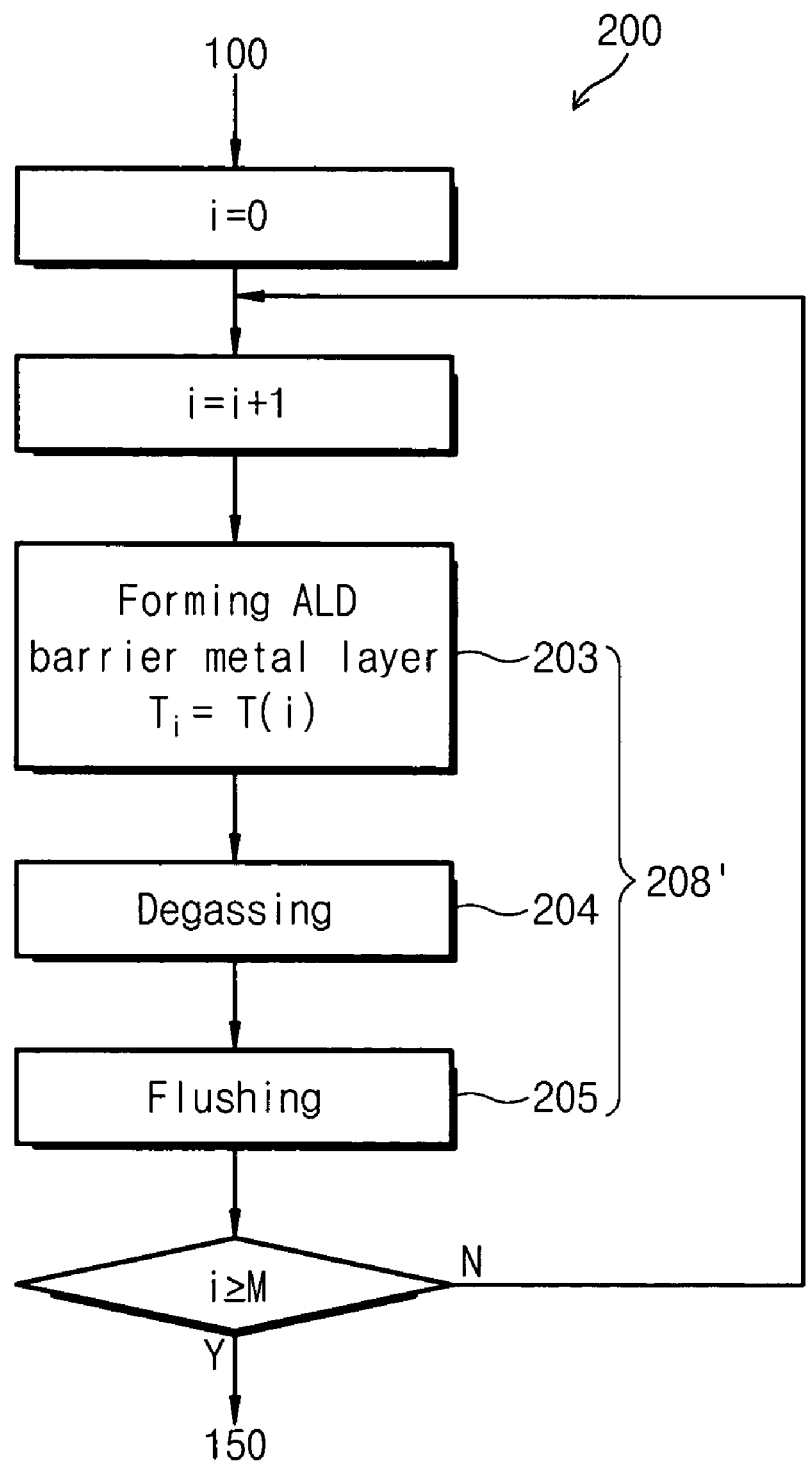
Figure 11:
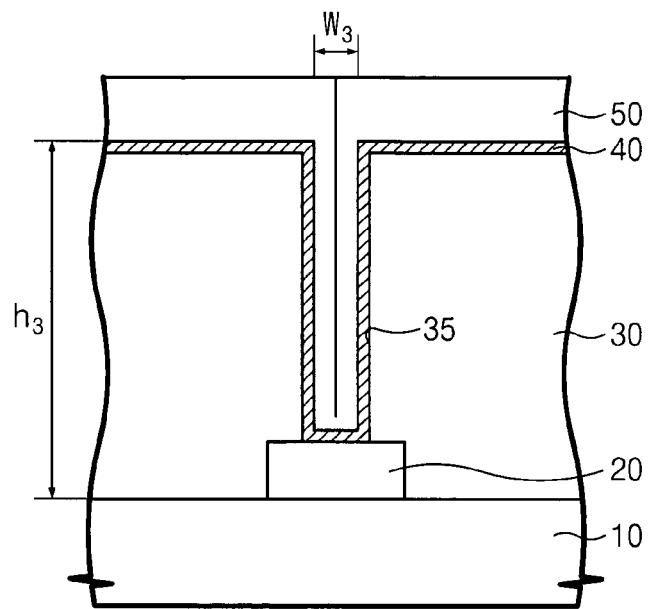
FIGS. 11 and 12 are cross-sectional views that illustrate a conductive structure on a substrate and methods of forming the same in accordance with some embodiments of the present invention.

Referring now to FIG. 10, in accordance with other embodiments of the present invention, the process cycle 208 of FIG. 9 may further comprise a degassing operation (block 204) to form process cycle 208'. The degassing operation (block 204) is applied to the barrier metal layer 40, which is formed using atomic layer deposition (block 203), before the flushing operation is performed (block 205). The degassing operation (block 204) may be performed as discussed above with respect to block 120 of FIG. 4.

Figure 8:
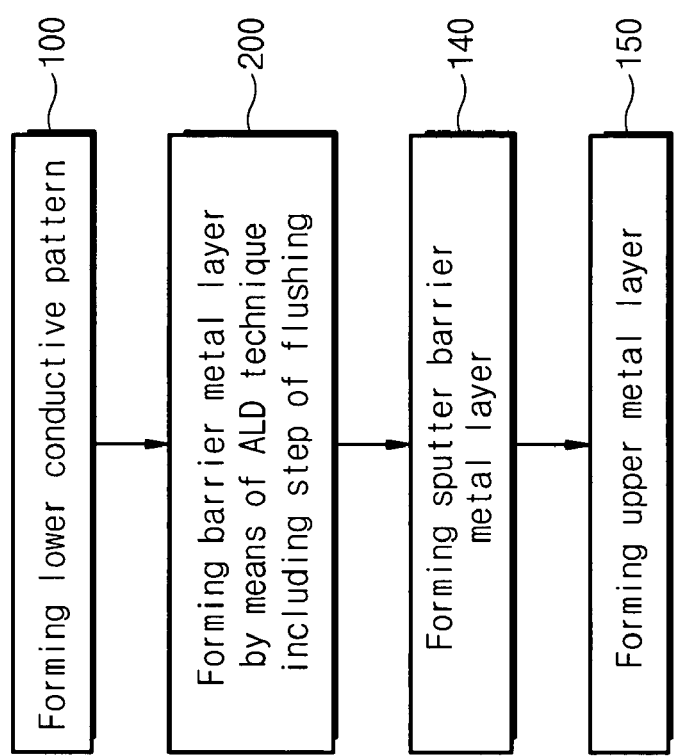

Referring now to FIGS. 8 and 12, after forming the barrier metal layer 40 by using atomic layer deposition (block 200), the second barrier metal layer 42 may be formed using sputtering as discussed above with respect to block 140 of FIG. 5.

According to some embodiments of the present invention discussed above, a surface of the barrier metal layer 40 may be flushed (blocks 130 and 205) so that the upper metal layer 50 has a generally good gap-fill characteristic when the aspect ratio ($h_3/w_3$) of the via hole 35 is 13 or more. In addition, the upper metal layer 50 may not be pilled off, i.e., an adhesion characteristic of the upper metal layer 50 may be improved.

Some embodiments of the present invention provide a method for forming a conductive structure that includes flushing a barrier metal layer formed by using metal organic chemical vapor deposition or atomic layer deposition. The barrier metal layer can be formed at a relatively low temperature by using metal organic chemical vapor deposition or atomic layer deposition. The flushing process for cleaning the surface of the barrier metal layer may reduce problems resulting from an insufficient removal of carbon and outgassing oxygen. Therefore, the gap-fill characteristic and adhesion characteristic of the upper metal layer formed subsequently may be improved. The flushing operation may be performed at a relatively low temperature, such that a thermal budget may be reduced. As a result, a conductive structure having generally good characteristics may be formed using a relatively low temperature fabrication process.

In concluding the detailed description, it should be noted that many variations and modifications can be made to the described embodiments without substantially departing from the principles of the present invention. All such variations and modifications are intended to be included herein within the scope of the present invention, as set forth in the following claims.

What is claimed is:

1. A method of forming a conductive structure, comprising:
   providing a substrate;
   forming a lower conductive pattern on the substrate;
   forming a barrier metal layer on the lower conductive pattern;
   flushing the barrier metal layer with a gas that comprises a halogen group gas; and
   forming an upper conductive layer on the barrier metal layer.

2. The method of claim 1, wherein the gas further comprises a transition metal.

3. The method of claim 1, wherein the gas further comprises helium, neon, argon, hydrogen, and/or nitrogen.

4. The method of claim 1, wherein flushing the barrier metal layer comprises flushing the barrier metal layer at a temperature of about 200° C. to about 500° C.

5. The method of claim 1, wherein flushing the barrier metal layer comprises flushing the barrier metal layer with argon gas with a flux of about 500 sccm to about 10000 sccm and $TiCl_4$ gas with a flux of about 1 sccm to about 100 sccm at a temperature of about 300° C. to about 450° C.

6. The method of claim 1, wherein flushing the barrier metal layer comprises flushing the barrier metal layer at a pressure of about 1 torr to about 100 torr for about 1 sec to about 10 minutes.

7. The method of claim 1, wherein the lower conductive pattern comprises tungsten, aluminum, polysilicon, copper, titanium, titanium nitride, tantalum, tantalum silicon nitride, and/or tantalum nitride.

8. The method of claim 1, wherein the barrier metal layer comprises titanium nitride, titanium silicon nitride, tantalum silicon nitride, and/or tantalum nitride.

9. The method of claim 1, wherein forming the barrier metal layer comprises forming the barrier metal layer using chemical vapor deposition with a metal organic precursor.

10. The method of claim 1, wherein the upper conductive layer comprises tungsten, aluminum, polysilicon, and/or copper.

11. The method of claim 1, further comprising:
    treating the barrier metal layer with plasma before flushing the barrier metal layer.

12. The method of claim 1, wherein the plasma comprises a processing gas that comprises hydrogen and/or nitrogen.

13. The method of claim 1, further comprising:
    degassing the barrier metal layer before flushing the barrier metal layer.

14. The method of claim 13, wherein degassing the barrier metal layer comprises degassing the barrier metal layer using an inert gas at a temperature of about 200° C. to about 500° C. and a pressure of about 1 mTorr to about 100 Torr.

15. The method of claim 13, wherein the barrier metal layer is a first barrier metal layer, the method further comprising:
    forming a second barrier metal layer on the first barrier metal layer before forming the upper conductive layer.

16. The method of claim 1, wherein the barrier metal layer is a first barrier metal layer, the method further comprising:
    forming a second barrier metal layer on the first barrier metal layer before forming the upper conductive layer.

17. The method of claim 16, wherein forming the second barrier metal layer comprises forming the second barrier metal layer using physical vapor deposition including sputtering.

18. The method of claim 16, wherein the second barrier metal layer comprises titanium nitride, titanium silicon nitride, tantalum silicon nitride, and/or tantalum nitride.

19. The method of claim 1, wherein forming the barrier metal layer comprises forming the barrier metal layer using atomic layer deposition.

20. The method of claim 19, wherein forming the barrier metal layer using atomic layer deposition and flushing the barrier metal layer are performed at least twice.

21. The method of claim 19, further comprising:
    degassing the barrier metal layer before flushing the barrier metal layer.

22. The method of claim 21, wherein forming the barrier metal layer using atomic layer deposition, degassing the barrier metal layer, and flushing the barrier metal layer are performed at least twice.

23. The method of claim 21, wherein the barrier metal layer is a first barrier metal layer, the method further comprising:
    forming a second barrier metal layer on the first barrier metal layer before forming the upper conductive layer.

24. A method of forming a conductive structure of a semiconductor device, comprising:
    forming a lower conductive pattern on a semiconductor substrate;
    depositing a barrier metal layer on the semiconductor substrate with the lower conductive pattern using a metal organic precursor;
    flushing the deposited barrier metal layer; and
    forming an upper conductive layer on the semiconductor substrate with the flushed barrier metal layer,
    wherein the step of flushing the barrier metal layer uses a processing gas including $TiCl_4$ gas and argon gas.

25. The method of claim 24, wherein the barrier metal layer comprises titanium nitride (TiN), titanium silicon nitride (TiSiN), tantalum silicon nitride (TaSiN) and/or tantalum nitride (TaN).

26. The method of claim 24, wherein the metal organic precursor is TDEAT or TDMAT.

27. The method of claim 24, wherein the barrier metal layer is formed using a metal organic chemical vapor deposition (MO-CVD) or an atomic layer deposition (ALD) process.

28. The method of claim 27, wherein the ALD process comprises a purging process using nitrogen ($N_2$), hydrogen ($H_2$), ammonia ($NH_3$) and/or titan tetrachloride ($TiCl_4$) as a purging gas.

29. The method of claim 24, wherein forming the barrier metal layer further comprises plasma treatment.

30. The method of claim 29, wherein the plasma treatment uses a processing gas comprising nitrogen and/or hydrogen gases.

31. The method of claim 24, further comprising degassing the barrier metal layer at an inert gas ambience before flushing the barrier metal layer,
  wherein the degassing step is performed at a temperature of about 200° C. to 500° C. under a pressure of about 1 mTorr to 100 Torr.

32. The method of claim 24, wherein flushing the barrier metal layer is performed at a temperature of about 200° C. to 500° C.

33. The method of claim 24, wherein the argon gas is provided with a flux of about 500 sccm to 10000 sccm, and the $TiCl_4$ gas is provided with a flux of about 1 sccm to 100 sccm.

34. The method of claim 24, wherein flushing the barrier metal layer is performed under a pressure of about 1 torr to 100 torr.

35. The method of claim 24, wherein flushing the barrier metal layer is performed for about 1 sec to 10 min.

36. The method of claim 24, wherein the barrier metal layer is a first barrier metal layer, the method further comprising:
  forming a second barrier metal layer after flushing the first barrier metal layer,
  wherein the second barrier metal layer is formed using sputtering technology.

37. The method of claim 36, wherein the second barrier metal layer comprises titanium nitride (TiN), titanium silicon nitride (TiSiN), tantalum silicon nitride (TaSiN) and/or tantalum nitride (TaN).

38. The method of claim 24, wherein forming the barrier metal layer and flushing the barrier metal layer are repeated at least once.

* * * * *